United States Patent
Yang et al.

(10) Patent No.: US 9,893,046 B2
(45) Date of Patent: Feb. 13, 2018

(54) THINNING PROCESS USING METAL-ASSISTED CHEMICAL ETCHING

(71) Applicant: Taiwan Semiconductor Manufacturing Co., Ltd., Hsinchu (TW)

(72) Inventors: Su-Chun Yang, Hsinchu (TW); Yi-Li Hsiao, Hsinchu (TW); Tung-Liang Shao, Hsinchu (TW); Chih-Hang Tung, Chu-Pei (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 38 days.

(21) Appl. No.: 15/205,238

(22) Filed: Jul. 8, 2016

(65) Prior Publication Data

US 2018/0012880 A1    Jan. 11, 2018

(51) Int. Cl.
*H01L 25/00* (2006.01)
*H01L 25/065* (2006.01)
*H01L 25/18* (2006.01)

(52) U.S. Cl.
CPC .......... *H01L 25/50* (2013.01); *H01L 25/0657* (2013.01); *H01L 25/18* (2013.01); *H01L 2225/06513* (2013.01); *H01L 2225/06537* (2013.01); *H01L 2225/06541* (2013.01); *H01L 2225/06555* (2013.01); *H01L 2225/06582* (2013.01); *H01L 2225/06589* (2013.01)

(58) Field of Classification Search
CPC ...... H01L 25/50; H01L 25/0657; H01L 25/18
See application file for complete search history.

(56) References Cited

U.S. PATENT DOCUMENTS

| | | |
|---|---|---|
| 7,564,115 B2 | 7/2009 | Chen et al. |
| 7,633,165 B2 | 12/2009 | Hsu et al. |
| 7,825,024 B2 | 11/2010 | Lin et al. |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |

(Continued)

OTHER PUBLICATIONS

Li et al., "Uniform Vertical Trench Etching on Silicon with High Aspect Ratio by Metal-Assisted Chemical Etching Using Nanoporous Catalysts", ACS Applied Materials and Interfaces, 2014, 6, 575-584.

*Primary Examiner* — Errol Fernandes
(74) *Attorney, Agent, or Firm* — Birch, Stewart, Kolasch & Birch, LLP

(57) ABSTRACT

Methods for forming a chip package are provided. The method includes providing at least one carrier substrate including first semiconductor dies mounted thereon. The method also includes forming a first noble metal layer including nanopores irregularly distributed therein to cover each one of the first semiconductor dies. The method further includes immersing the carrier substrate with the first semiconductor dies into an etchant solution including a fluoride etchant and an oxidizing agent, so that each one of the first semiconductor dies covered by the first noble metal layer is thinned.

20 Claims, 14 Drawing Sheets

(56) References Cited

U.S. PATENT DOCUMENTS

| | | | |
|---|---|---|---|
| 8,278,191 B2 * | 10/2012 | Hildreth | B81C 1/00071 |
| | | | 438/460 |
| 8,426,961 B2 | 4/2013 | Shih et al. | |
| 8,669,174 B2 | 3/2014 | Wu et al. | |
| 8,802,504 B1 | 8/2014 | Hou et al. | |
| 8,803,292 B2 | 8/2014 | Chen et al. | |
| 8,803,316 B2 | 8/2014 | Lin et al. | |
| 9,478,685 B2 * | 10/2016 | Yu | H01L 27/1443 |
| 2011/0266521 A1 * | 11/2011 | Ferrari | B82Y 10/00 |
| | | | 257/14 |
| 2012/0119760 A1 * | 5/2012 | Pehrsson | H01L 29/0665 |
| | | | 324/691 |
| 2012/0168713 A1 * | 7/2012 | Lee | B82Y 30/00 |
| | | | 257/9 |
| 2013/0012022 A1 * | 1/2013 | Hung | H01L 29/0669 |
| | | | 438/680 |
| 2013/0244369 A1 * | 9/2013 | Nishimoto | H01L 31/02363 |
| | | | 438/71 |
| 2014/0001645 A1 | 1/2014 | Lin et al. | |
| 2014/0225258 A1 | 8/2014 | Chiu et al. | |
| 2014/0252572 A1 | 9/2014 | Hou et al. | |
| 2015/0287697 A1 | 10/2015 | Tsai et al. | |
| 2015/0348872 A1 | 12/2015 | Kuo et al. | |
| 2016/0126133 A1 * | 5/2016 | Li | H01L 21/78 |
| | | | 438/667 |

* cited by examiner

THINNING PROCESS USING METAL-ASSISTED CHEMICAL ETCHING

BACKGROUND

In the packaging of integrated circuits, semiconductor dies may be stacked and bonded to other package components (e.g., interposers and package substrates). The resulting packages are known as three-dimensional integrated circuits (3DICs). 3DICs have become very popular in recent years due to the increased levels of integration they provide. 3DICs typically utilize through silicon via (TSV) structures which penetrate through substrates and are employed to electrically connect features on opposite sides of the substrates.

The formation process for TSV structures at least includes etching or drilling into the substrate to form TSV openings and thinning the substrate before or after forming the TSV openings. The TSV openings are then filled with a conductive material to form the TSV structures. It would therefore be desirable to take advantage of the advanced integration levels afforded by 3DICs using TSV structures while avoiding problems created by forming such TSV structures.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
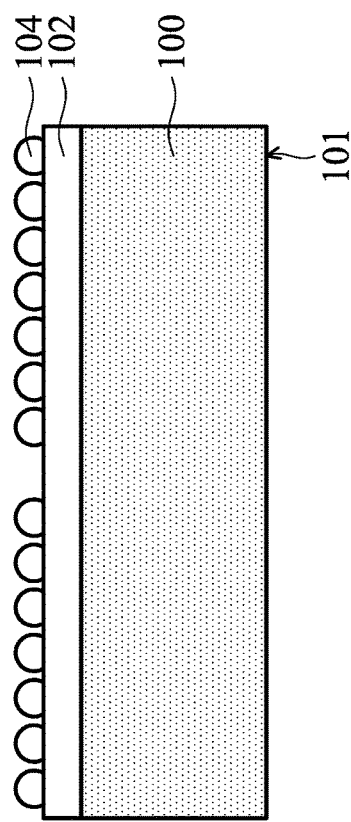
FIGS. 1A-1I are cross-sectional views of various stages of a method for forming a chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Chip-on-Wafer (CoW) packages and methods for forming the same are provided in accordance with exemplary embodiments. The intermediate stages of forming the CoW packages in accordance with embodiments are illustrated. The various embodiments are discussed, in which like reference numbers are used to designate like elements.

Some embodiments of the disclosure are described. FIGS. 1A-1I are cross-sectional views of various stages of a method for forming a chip package, in accordance with some embodiments. Additional operations can be provided before, during, and/or after the stages described in FIGS. 1A-1I. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As shown in FIG. 1A, a device wafer is provided, in accordance with some embodiments. The device wafer may include a substrate 100, an interconnect structure 102, and connectors 104. The substrate 100 is made of a semiconductor material, such as silicon. A variety of device elements (not shown) may be formed in or over the semiconductor substrate 100. Such device elements may include active devices (such as transistors) and/or passive devices (such as resistors and/or capacitors).

The interconnect structure 102 is formed over the substrate 100. Interconnect structure 102 may include a plurality of dielectric layers. Metal lines are formed in dielectric layers. Vias are formed between, and interconnecting, the overlying and underlying metal lines. Metal lines and vias are sometimes referred to as redistribution lines (RDLs). In order to simplify the diagram, only a flat layer is depicted. In some embodiments, dielectric layers include silicon oxide, silicon nitride, silicon carbide, silicon oxynitride, or combinations thereof. Alternatively, dielectric layers may include one or more low-k dielectric layer having low k values. The k values of the low-k dielectric materials in dielectric layers may be lower than about 3.0, or lower than about 2.5, for example. In some embodiments, the interconnect structure 102 also includes a passivation layer (not shown) formed on the dielectric layers and conductive pads (not shown) formed in the passivation layer. The passivation layer may be a polymer layer or a polymer-containing layer. For example, the passivation layer may be a poly-p-phenylenebenzobisthiazole (PBO) layer, a polyimide (PI) layer, another suitable layer, or a combination thereof. Alternatively or additionally, the passivation layer may include benzocyclobutene (BCB). In some embodiments, the passivation layer includes silicon nitride, silicon carbide, another suitable material, or a combination thereof.

Connectors 104 are formed over the interconnect structure 102. In some embodiments, connectors 104 include solder balls. In alternative embodiments, connectors 104 include metal pillars that may be, or may not be covered by solder caps, respectively. In yet other embodiments, connectors 104 are composite bumps including copper posts, nickel layers, solder caps, and/or the like.

Figure 1B:
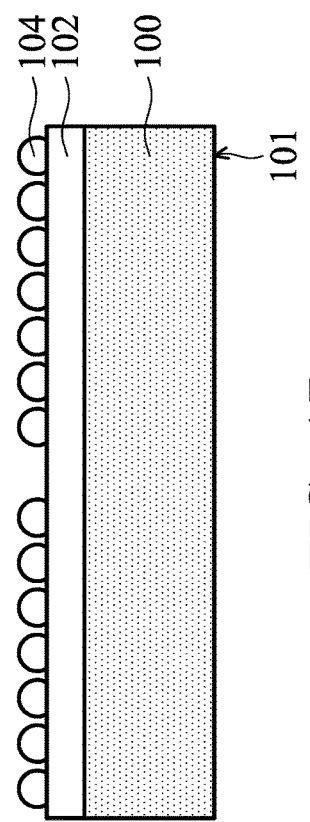

As shown in FIG. 1B, a thinning process, such as a backside grinding process, is performed on a surface 101 of the substrate 100, in accordance with some embodiments. As a result, the substrate 100 is thinned to a thickness of about 100 μm. In this case, the surface 101 is opposite to the surface of the substrate 100 where the interconnect structure 102 is formed thereon.

Figure 1C:
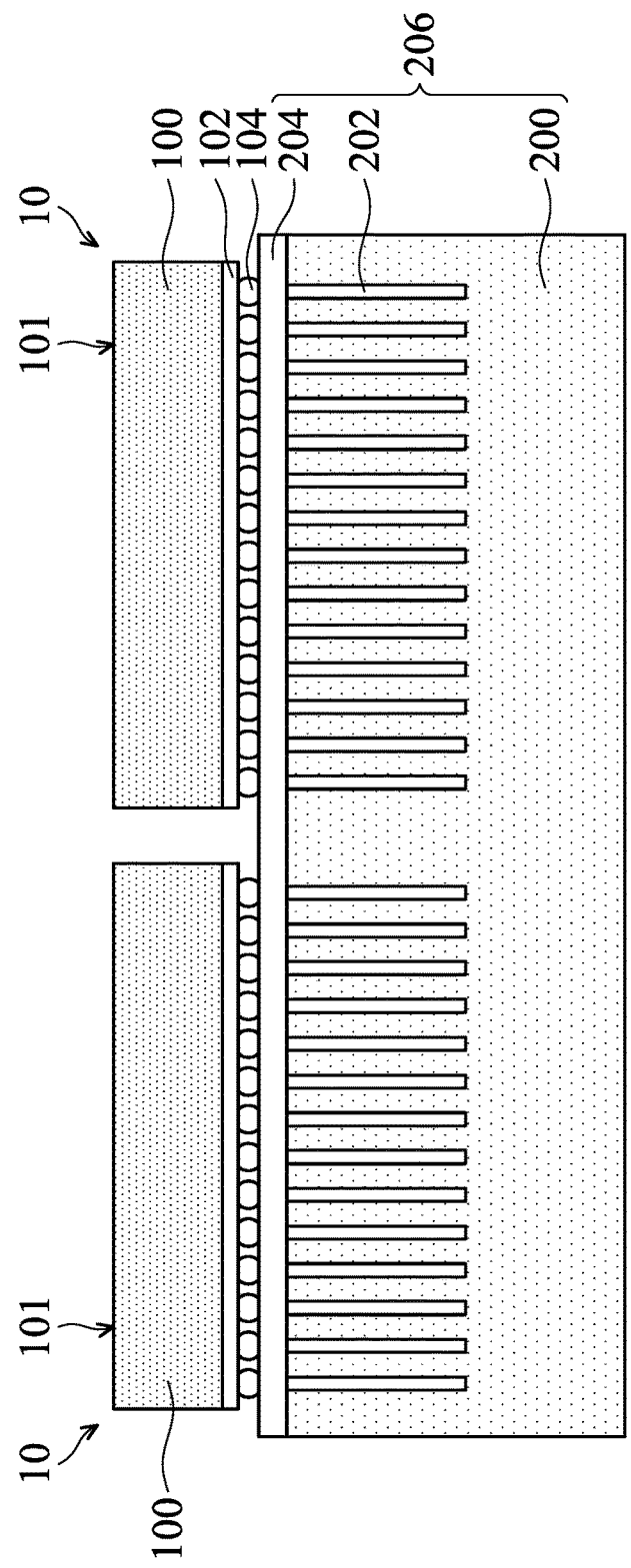

As shown in FIG. 1C, carrier substrates are provided, in accordance with some embodiments. In order to simplify the diagram, only one carrier substrate 206 is depicted. The carrier substrate 206 may be an interposer wafer, a device wafer, or the like. In some embodiments, the carrier substrate 206 is the interposer wafer. The interposer wafer may be made of a semiconductor material, ceramic material, polymer material, metal material, another suitable material, or a combination thereof. Moreover, the carrier substrate 206 includes a base 200 and does not have an active device therein. In this case, the carrier substrate 206 may or may not include passive devices formed therein. The base 200 may be made of a semiconductor material, such as silicon, silicon germanium, silicon carbon, or the like.

In some embodiments, through-substrate vias (TSVs) 202 are formed to extend from the top surface of base 200 into the base 200. TSVs 202 are also sometimes referred as through-silicon vias when base 200 is made of silicon.

An interconnect structure 204 is formed over base 200 of the carrier substrate 206. Interconnect structure 204 may include one or more dielectric layers. Metal lines are formed in the dielectric layer(s). Vias are formed between, and interconnecting, the overlying and underlying metal lines. Metal lines and vias in interconnect structure 204 are sometimes referred to as RDLs that are electrically coupled to the TSVs 202 thereunder. In order to simplify the diagram, only a flat layer is depicted. In some embodiments, dielectric layers include silicon oxide, silicon nitride, silicon carbide, silicon oxynitride, or combinations thereof. In some embodiments, interconnect structure 204 also includes a passivation layer (not shown) formed on the dielectric layer(s) and conductive pads (not shown) formed in the passivation layer. The passivation layer may be a polymer layer or a polymer-containing layer. For example, the passivation layer may be a PBO layer, a PI layer, another suitable layer, or a combination thereof. Alternatively or additionally, the passivation layer may include BCB. In some embodiments, the passivation layer includes silicon nitride, silicon carbide, another suitable material, or a combination thereof A dicing process is performed on the structure shown in FIG. 1B along scribe lines (not shown), in accordance with some embodiments. After the sawing, individual semiconductor dies 10 are formed. In this case, semiconductor dies 10 are homogeneous semiconductor dies with the same functionality. For example, semiconductor dies 10 may be memory dies (e.g., DRAM dies). Afterwards, semiconductor dies 10 are mounted onto interconnect structure 204 of each carrier substrate 206. For example, semiconductor dies 10 are mounted onto each carrier substrate 206 through flip-chip bonding. Connectors 104 accordingly electrically couple to the conductive pads of interconnect structure 204. In order to simplify the diagram, only two semiconductor dies 10 are depicted in FIG. 1C.

Figure 1D:
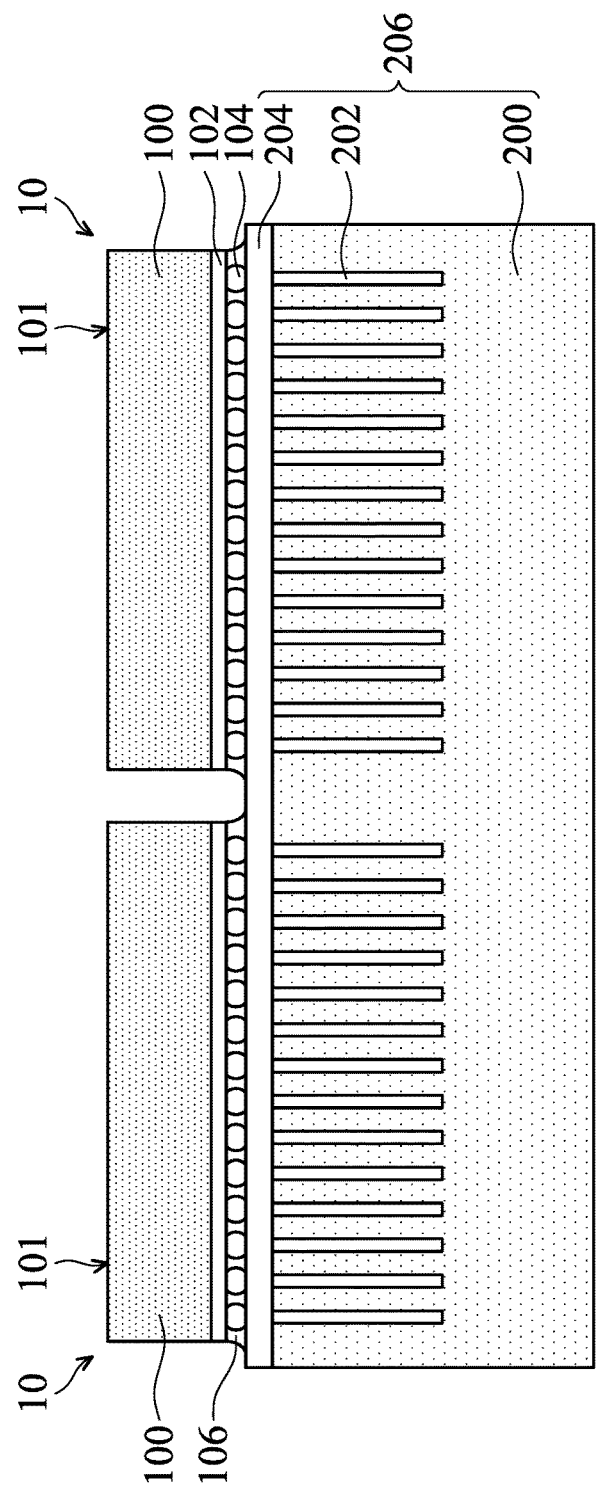

As shown in FIG. 1D, an underfill layer 106 is formed into the space (gaps) between each of the semiconductor dies 10 and the carrier substrate 206, in accordance with some embodiments. The underfill layer 106 may include polymers such as epoxy. In some embodiments, the underfill layer 106 is a molding underfill.

Figure 1E:
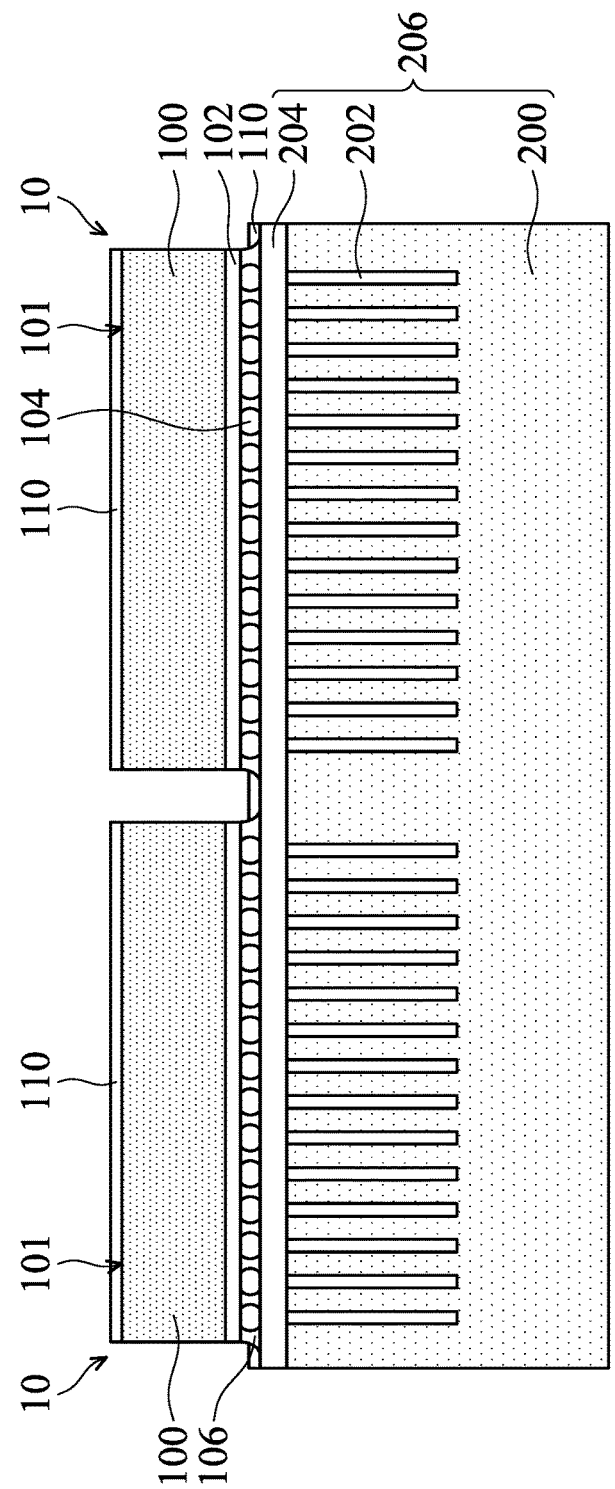

As shown in FIG. 1E, a noble metal layer 110 is formed to cover the surface 101 of each of the semiconductor dies 10 and the interconnect structure 204 of carrier substrate 206, in accordance with some embodiments. In some embodiments, the noble metal layer 110 is formed in a sufficient thickness to have nanopores (not shown) irregularly distributed therein, so that the surface 101 of each one of the semiconductor dies 10 is partially exposed through these nanopores. For example, the noble metal layer 110 has a thickness in a range of 5 nm to 20 nm.

In some embodiments the noble metal layer 110 is made of gold (Au). In some embodiments, the noble metal layer 110 is formed by a physical vapor deposition (PVD) process, a chemical vapor deposition (CVD) process, an evaporation process, or another applicable process. However, embodiments of the disclosure are not limited thereto. Other noble metal, such as silver (Ag), platinum (Pt), or palladium (Pd), may also be used as the noble metal layer 110.

Figure 1F:
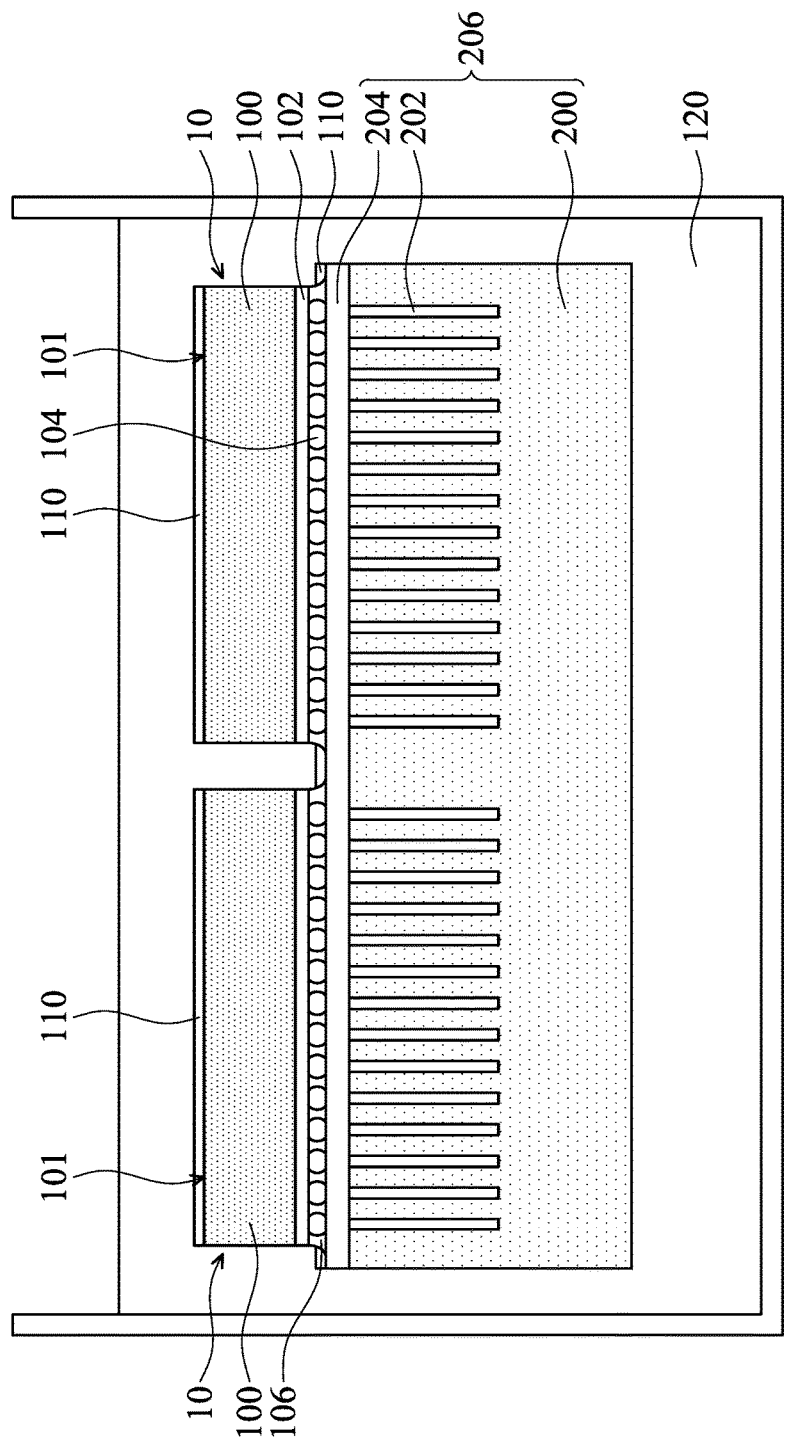

As shown in FIG. 1F, the carrier substrate 206 with semiconductor dies 10 that are covered by the noble metal layer 110 are immersed into an etchant solution 120, in accordance with some embodiments. In some embodiments, more than one carrier substrates 206 are simultaneously immersed into the etchant solution 120 for performing a batch etching process, so that semiconductor dies 10 covered by the noble metal layer 110 and mounted on each of the carrier substrates 206 are thinned simultaneously.

In some embodiments, the etching process is a metal-assisted chemical etching (MaCE) process. The MaCE is an electroless chemical etching technology that can etch substrate or wafer formed of silicon. Typically, the etchant solution 120 used for MaCE process includes a fluoride etchant and an oxidizing agent. For example, the fluoride etchant include hydrofluoric acid (HF) and the oxidizing agent comprises hydrogen peroxide ($H_2O_2$). In some embodiments, the etchant solution 120 further includes deionized (DI) water ($H_2O$). In these cases, the volume ratio of HF:$H_2O_2$:$H_2O$ may be in a range of 1-5:3-20:10-90.

In such a MaCE process, the noble metal layer 110 on each of the semiconductor dies 10 acts as a cathode and the semiconductor die 10 containing silicon acts as an anode. During such an etching, the etchant solution 120 comes into contact with the noble metal layer 110 for reduction of the oxidizing agent and also comes into contact with the exposed surface 101 of the semiconductor die 10 via the nanopores in the noble metal layer 110 for silicon dissolution. Namely, such an etching begins as the oxidizing agent (e.g., $H_2O_2$) is reduced at the cathode (i.e., noble metal layer 110) to generate holes (h+). Moreover, these holes are consumed at the anode (i.e., silicon surface 101 of semiconductor die 10) to produce soluble $SiF_6$ and $H_2SiF_6$.

As a result, the thinned semiconductor dies 10a formed by etching the surface 101 of each of the semiconductor dies 10. The etching rate may depend on the temperature of the etchant solution 120. As the temperature of the etchant solution 120 is increased, the etching rate is increased. In some embodiments, the temperature of etchant solution 120 is in a range of about 25° C. to 100° C. Additionally, an optional stirring process may also be performed during the immersion of carrier substrates 206 with semiconductor dies 10 into the etchant solution 120, so as to further increase the etching rate.

In some embodiments, thinned semiconductor dies 10a on the carrier substrate 206 (i.e., interposer wafer) have a thickness of about 5 μm to 10 μm. Afterwards, the carrier substrates 206 with thinned semiconductor dies 10a are removed from the etchant solution 120.

Figure 1G:
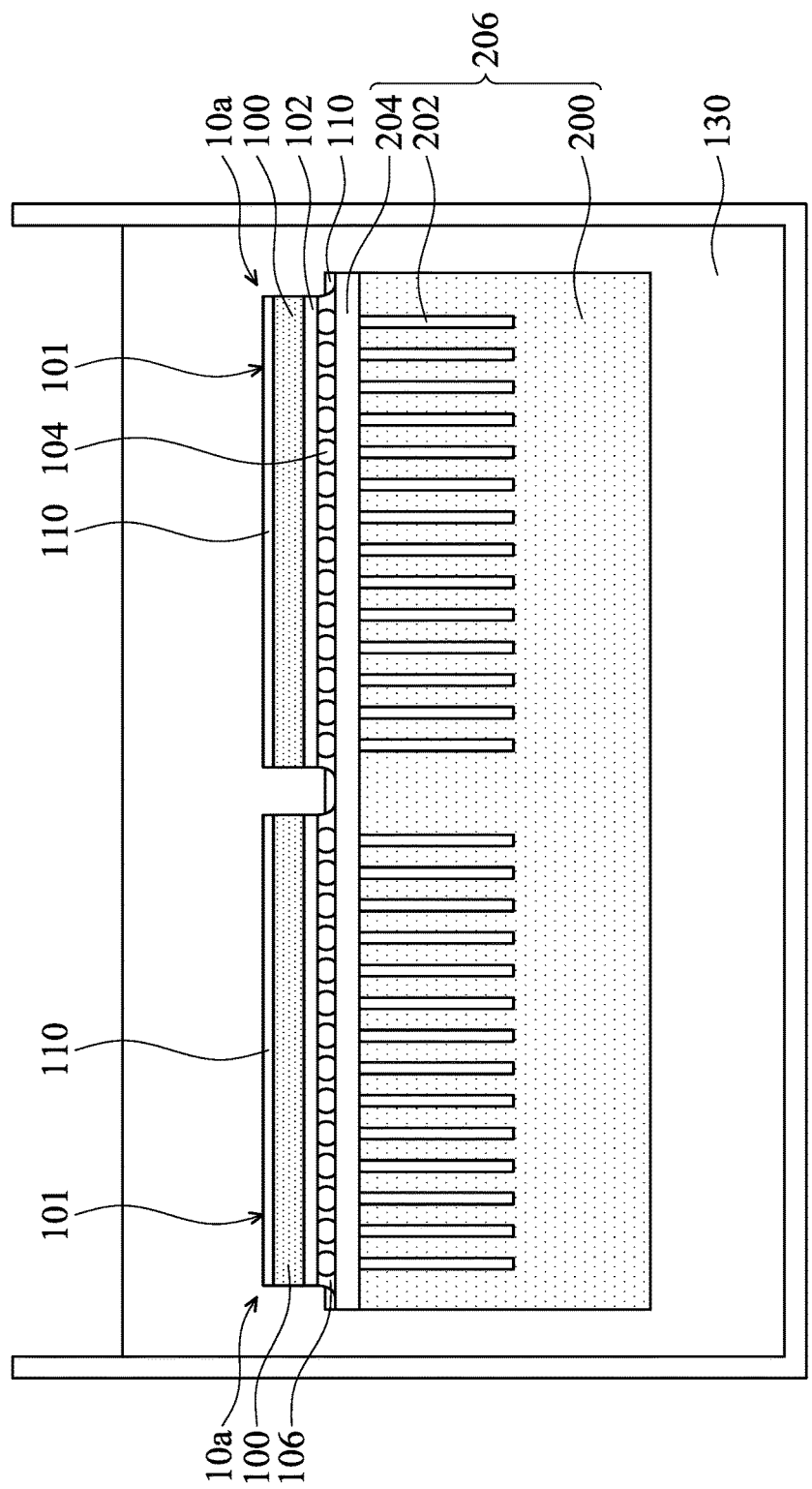

As shown in FIG. 1G, after the removal of the carrier substrate 206 with thinned semiconductor dies 10a, a cleaning process is performed on the carrier substrate 206 with thinned semiconductor dies 10a, in accordance with some embodiments. For example, the carrier substrate 206 may be immersed into DI water 130 for performing the cleaning process. Moreover, the cleaning process may be a batch process for cleaning more than one carrier substrate 206.

Figure 1H:
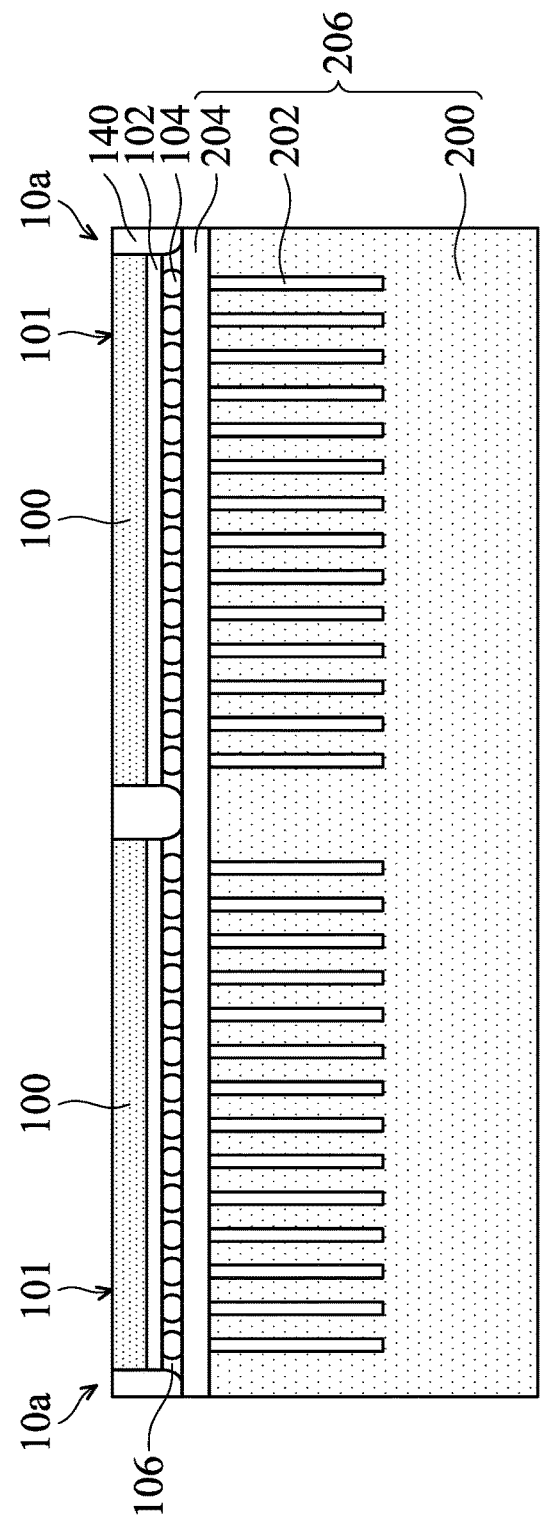

As shown in FIG. 1H, after performing the cleaning process, carrier substrate 206a with thinned semiconductor dies 10a are removed from DI water 130 and a package layer 140 is formed over the carrier substrate 206, in accordance with some embodiments. In some embodiments, the package layer 140 is formed on the noble metal layer 110 to cover the carrier substrate 206 and thinned semiconductor dies 10a. In these cases, the noble metal layer 110 on the interconnect structure 204 of carrier substrate 206 may act as an electromagnetic interference (EMI) shielding layer and a heat-spreading layer. In some embodiments, before the formation of the package layer 140, the noble metal layer 110 formed on the interconnect structure 204 of carrier substrate 206 is removed by wet etching using an etchant solution including HCl and $HNO_3$ or including $I_2$, KI, and $H_2O$, as shown in FIG. 1H.

In some embodiments, the package layer 140 may completely encapsulate thinned semiconductor dies 10a, so that the noble metal layer 110 and the sidewalls of thinned semiconductor dies 10a are covered by the package layer 140. In some embodiments, the package layer 140 partially encapsulates thinned semiconductor dies 10a. For example, the noble metal layer 110 on each of the thinned semiconductor dies 10a is exposed from the top surface of package layer 140.

In some embodiments, the package layer 140 includes a polymer material. In some embodiments, the package layer 140 includes a molding compound. For example, a liquid molding compound material is applied over each of the carrier substrates 206 to encapsulate thinned semiconductor dies 10. Afterwards, a thermal process is then applied to harden the liquid molding compound material, thereby transforming it into the package layer 140. In some embodiments, the thermal process is performed at a temperature in a range of about 200° C. to 230° C. The operation time of the thermal process may be in a range of about 1 hour to about 3 hours.

Afterwards, the package layer 140 is thinned, so as to entirely remove the noble metal layer 110, thereby exposing the etched surface 101 of each of the thinned semiconductor dies 10a. For example, a planarization process may be used to thin the package layer 140. The planarization process may include a grinding process, a chemical mechanical polishing (CMP) process, or another applicable process. In some embodiments, the tops of thinned semiconductor dies 10a and thinned package layer 140 are substantially coplanar.

Figure 1I:
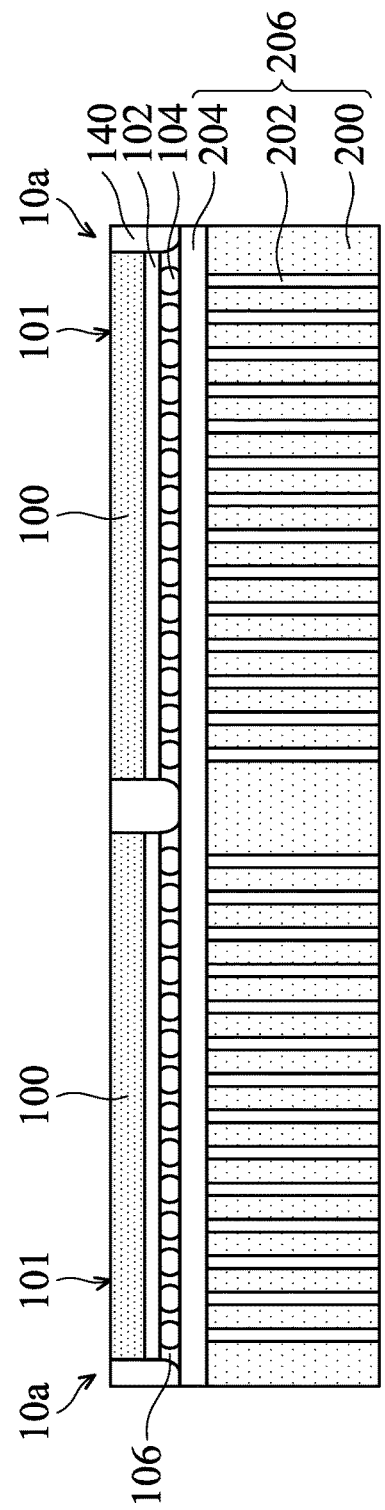

As shown in FIG. 1I, the base 200 of carrier substrate 206 is thinned to expose TSVs 202 formed in base 200, in accordance with some embodiments. For example, a planarization process may be used to thin the base 200. The planarization process may include a grinding process, a CMP process, an etching process, another applicable process, or a combination thereof. In some embodiments, bottom portions of TSVs 202 are exposed after the planarization process. In some embodiments, the bottoms of TSVs 202 and the thinned base 200 are substantially coplanar.

In some embodiments, a dicing process is performed on the carrier substrate 206 to form multiple chip packages, in which the chip package may include one or more thinned semiconductor dies 10a. In some other embodiments, more elements may be stacked on or bonded onto thinned semiconductor dies 10a before the dicing process.

Figure 2:
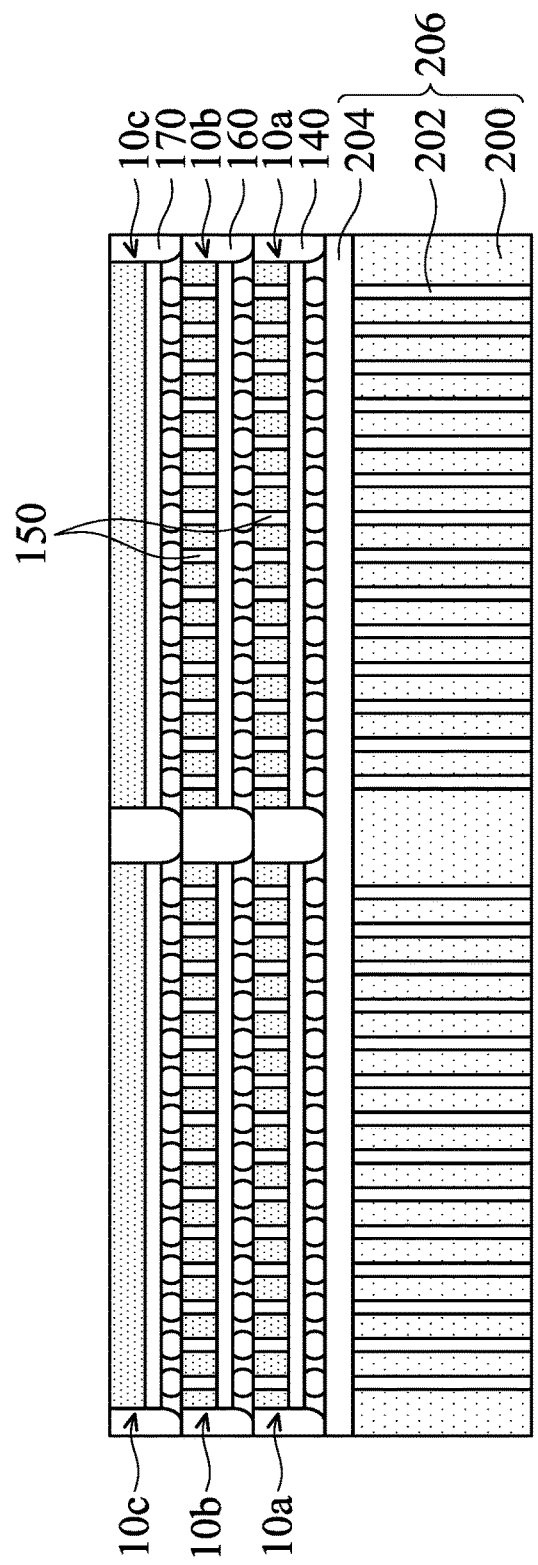
FIG. 2 is a cross-sectional view of a chip package, in accordance with some embodiments.

FIG. 2 is a cross-sectional view of a chip package, in accordance with some embodiments. As shown in FIG. 2, the chip package includes a similar structure to that shown in FIG. 1I and may be formed using a method that is the same as or similar to the method shown in FIGS. 1A to 1I. For example, a structure shown in FIG. 1H is provided. Moreover, a TSV process is performed in thinned semiconductor dies 10a to form TSVs 150 therein.

Semiconductor dies that are the same as semiconductor dies 10 are provided and correspondingly mounted on thinned semiconductor dies 10a. Namely, these semiconductor dies and thinned semiconductor dies 10a are homogeneous semiconductor dies with the same functionality. Afterwards, a noble metal layer (not shown) that includes nanopores irregularly distributed therein is formed to cover each of these semiconductor dies using the method shown in FIG. 1E. In some embodiments, the noble metal layer is made of a material that is the same as that of the noble metal layer 110 and the material includes gold, silver, platinum, or palladium.

The carrier substrate 206 with these semiconductor dies is immersed into the etchant solution 120 using the method shown in FIG. 1F, so as to form thinned semiconductor dies 10b. Afterwards, the carrier substrate 206 with thinned semiconductor dies 10b is removed from etchant solution 120 and a cleaning process is performed on carrier substrate 206 with thinned semiconductor dies 10b, as per the method shown in FIG. 1G.

A package layer 160 that is the same as or similar to the package layer 140 is formed over the package layer 140 to encapsulate the thinned semiconductor dies 10b, and then a planarization process such as a grinding process or a CMP process is performed to partially remove the package layer 160 and entirely remove the noble metal layer to expose each of the thinned semiconductor dies 10b, as per the method shown in FIG. 1H. In some embodiments, each of the thinned semiconductor dies 10a and each of the thinned semiconductor dies 10b has a thickness in a range of about 5 µm to 10 µm.

Similarly, a TSV process is performed in the thinned semiconductor dies 10b to form TSVs 150 therein. Moreover, thinned semiconductor dies 10c that are the same as thinned semiconductor dies 10a or 10b and a package layer 170 that is the same as the package layer 140 or 160 may be stacked on the package layer 160 and thinned semiconductor dies 10b using the method shown in FIGS. 1A to 1H. Afterwards, base 200 of carrier substrate 206 is thinned using the method shown in FIG. 1I. In some embodiments, a dicing process is performed on the carrier substrate 206 to form multiple chip packages, in which the chip package may include one or more sets of stacked and thinned semiconductor dies 10a, 10b, and 10c, as shown in FIG. 2.

Figure 3A:
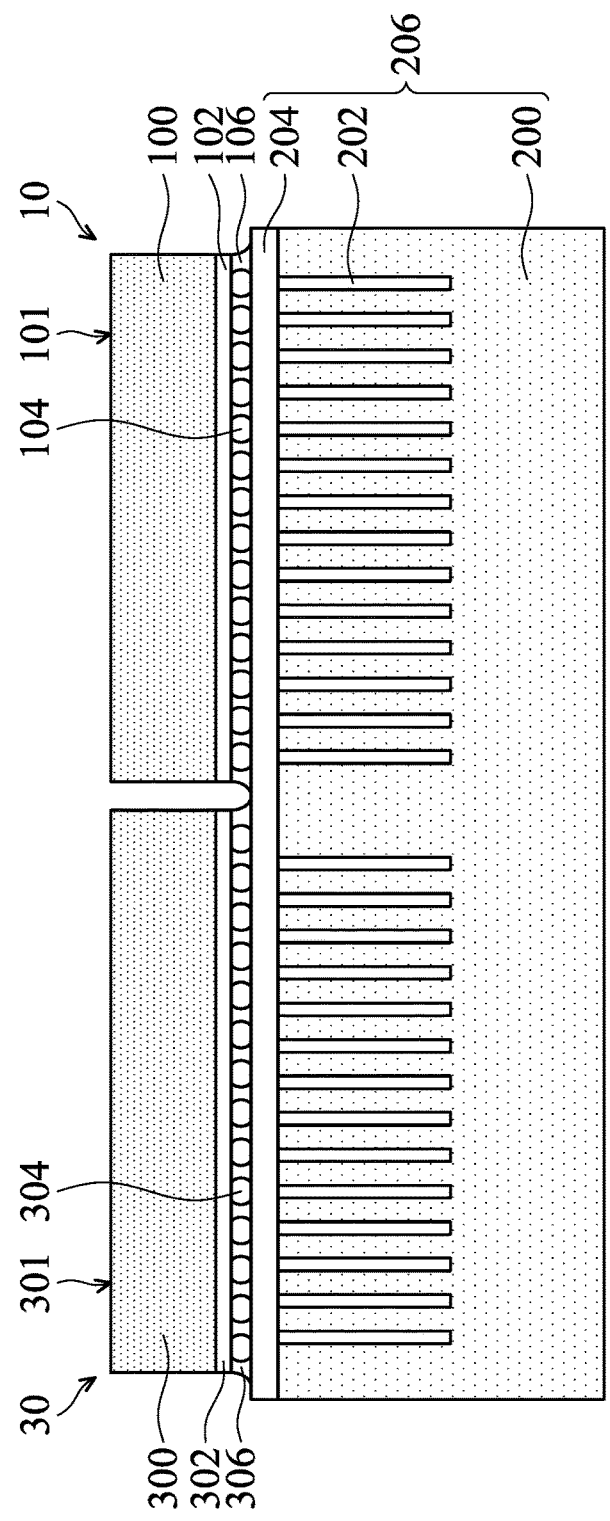
FIGS. 3A-3D are cross-sectional views of various stages of a method for forming a chip package, in accordance with some embodiments.

FIGS. 3A-3D are cross-sectional views of various stages of a process for forming a chip package, in accordance with some embodiments. In some embodiments, the chip package shown in FIG. 3D includes a similar structure to that shown in FIG. 1I and can be formed using a method that is the same as or similar to the method shown in FIGS. 1A to 1I. As shown in FIG. 3A, a similar structure to that shown in FIG. 1D is provided. Unlike the Structure shown in FIG. 1D, semiconductor dies 30 and 10 are mounted on the carrier substrate 206, in which semiconductor dies 30 and 10 are heterogeneous semiconductor dies with different functionalities. In order to simplify the diagram, only a semiconductor die 30 and a semiconductor die 10 are depicted in FIG. 3A. In some embodiments, semiconductor dies 10 include memory dies (e.g., DRAM dies) and semiconductor dies 30 include logic dies (e.g., graphics processing unit (GPU)). In some embodiments, the semiconductor die 30 includes a substrate 300, an interconnect structure 302, and connectors 304. The substrate 300 is made of a semiconductor material, such as silicon. A variety of device elements (not shown) may be formed in or over the semiconductor substrate 300. Such device elements may include active devices (such as transistors) and/or passive devices (such as resistors and/or capacitors).

The interconnect structure 302 is formed over the substrate 300 and may have a structure that is similar to that of the interconnect structure 102. Connectors 304 are formed over the interconnect structure 302 and may include a material that is the same as or similar to that of connectors 104. Semiconductor dies 30 are mounted onto the carrier substrate 206 through flip-chip bonding. Connectors 304 accordingly electrically couple to the conductive pads (not shown) of the interconnect structure 204. As shown in FIG. 3A, an underfill layer 306 is formed into the space (gaps) between each of the semiconductor dies 30 and the carrier substrate 206, in accordance with some embodiments. The underfill layer 306 may include a material that is the same as or similar to that of the underfill layer 106.

Figure 3B:
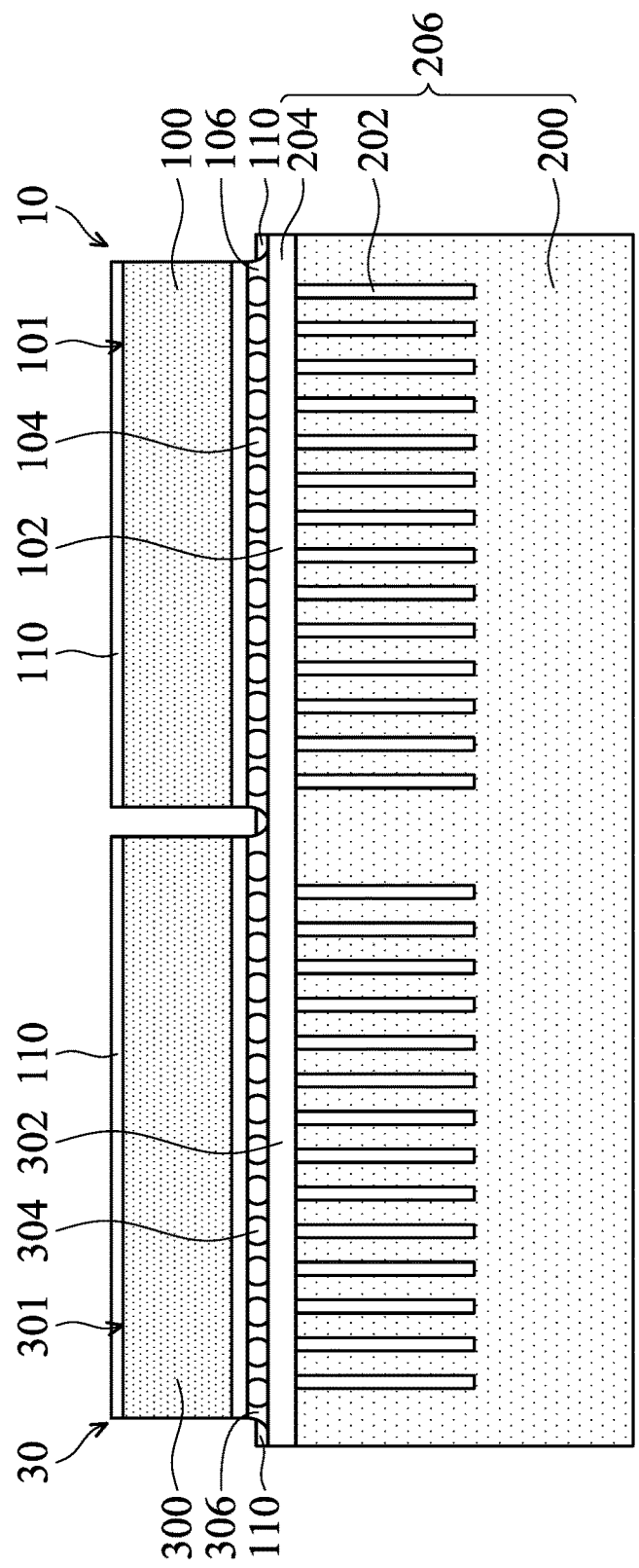

As shown in FIG. 3B, a noble metal layer 110 is formed to cover the surface 101 of each one of the semiconductor dies 10, the surface 301 of each one of the semiconductor dies 30 and the carrier substrate 206, in accordance with some embodiments. In some embodiments, the surface 301 of each one of the semiconductor dies 30 is also exposed through the nanopores of the noble metal layer 110.

One or more the carrier substrates 206 with semiconductor dies 10 and 30 that are covered by the noble metal layer 110 are immersed into an etchant solution (not shown), in accordance with some embodiments. The etchant solution may be the same as the etchant solution 120 shown in FIG. 1F. In some embodiments, more than one carrier substrate 206 are simultaneously immersed into the etchant solution for performing a batch etching process, so that each one of semiconductor dies 10 and 30 covered by the noble metal layer 110 are thinned.

In some embodiments, thinned semiconductor dies 10a and 30a on the carrier substrate 206 (i.e., interposer wafer) have a thickness of about 5 µm to 10 µm. Afterwards, the carrier substrate 206 with thinned semiconductor dies 10a and 30a is removed from the etchant solution 120.

After the removal of the carrier substrates 206 with thinned semiconductor dies 10a and 30a, a cleaning process is performed on carrier substrates 206 with thinned semiconductor dies 10a and 30a, in accordance with some embodiments. For example, the cleaning process is the same as the cleaning process shown in FIG. 1G. Also, the cleaning process may be a batch process for cleaning more than one carrier substrate 206 with thinned semiconductor dies 10a and 30a simultaneously.

Figure 3C:
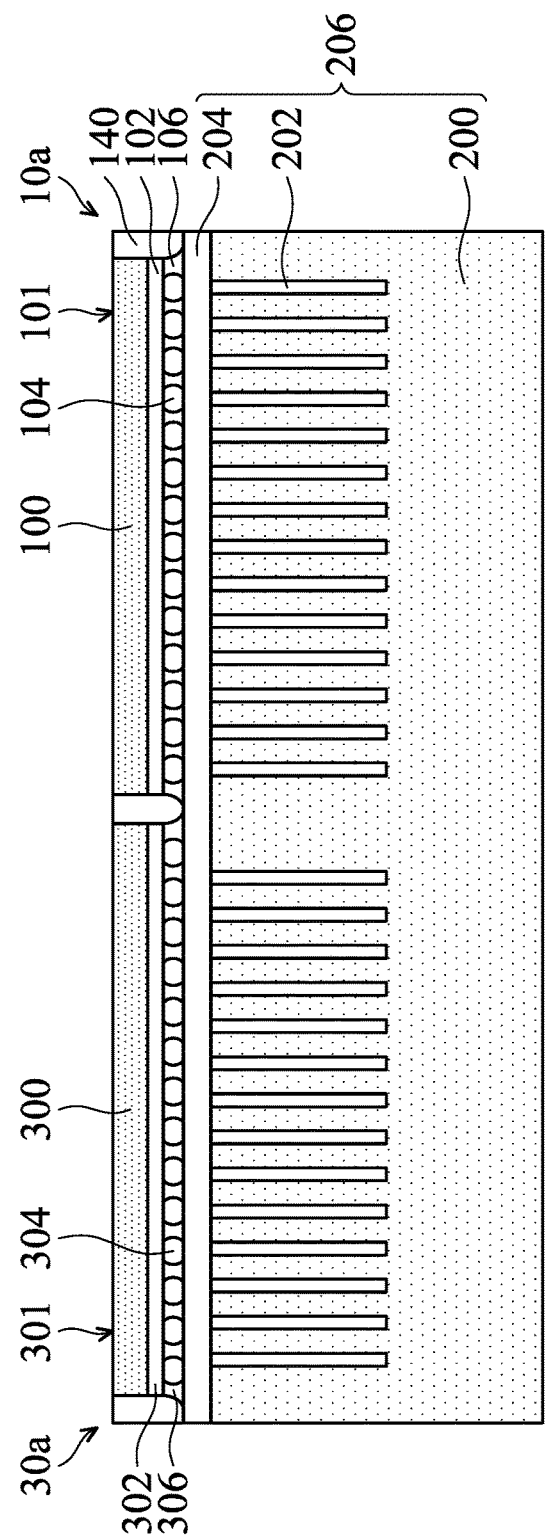

As shown in FIG. 3C, after performing the cleaning process, the carrier substrate 206 with thinned semiconductor dies 10a and 30a are removed from the DI water 130 and a package layer 140 is formed over the carrier substrate 206, in accordance with some embodiments. The package layer 140 is formed over the carrier substrate 206 and completely or partially encapsulates the corresponding thinned semiconductor dies 10a and 30a that are covered by noble metal layer 110.

Afterwards, the package layer 140 is thinned, so as to entirely remove the noble metal layer 110, thereby exposing the etched surface 101 of each of thinned semiconductor dies 10a and the etched surface 301 of each of thinned semiconductor dies 30a using the method shown in FIG. 1H. In some embodiments, the tops of thinned semiconductor dies 10a and 30a and thinned package layer 140 are substantially coplanar.

Figure 3D:
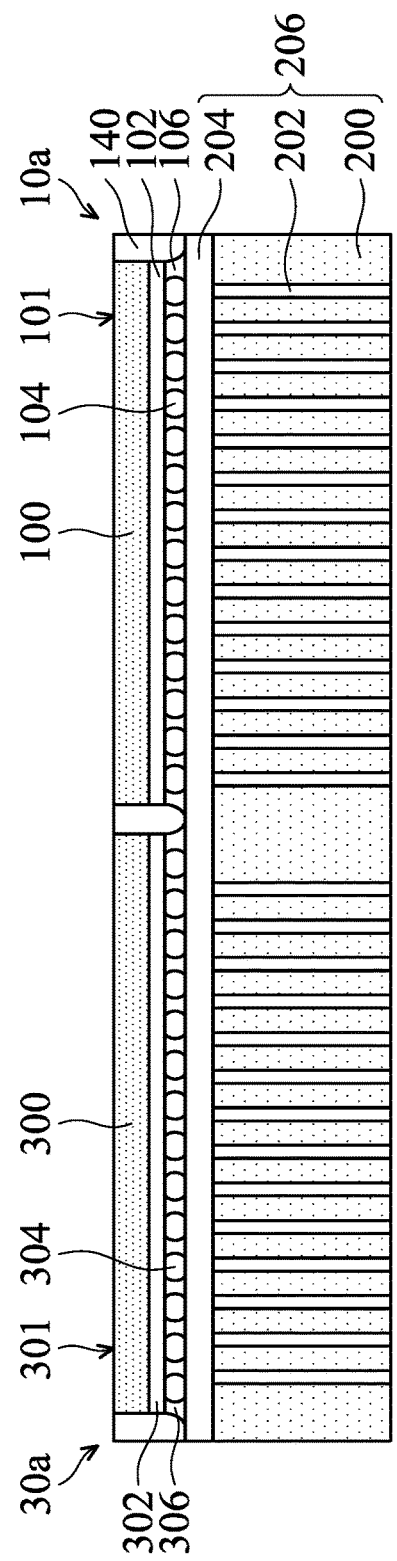

As shown in FIG. 3D, the base 200 of carrier substrate 206 is thinned to expose TSVs 202 formed in the base 200, in accordance with some embodiments. In some embodiments, the base 200 of carrier substrate 206 is thinned using the method shown in FIG. 1H. In some embodiments, bottom portions of TSVs 202 are exposed after the planarization process. In some embodiments, the bottoms of TSVs 202 and the thinned base 200 are substantially coplanar.

In some embodiments, a dicing process is performed on the carrier substrate 206 to form multiple chip packages, in which the chip package may include at least one thinned semiconductor die 10a and at least one thinned semiconductor die 30a. In some other embodiments, more elements may be stacked on or bonded onto thinned semiconductor dies 10a before the dicing process.

Figure 4:
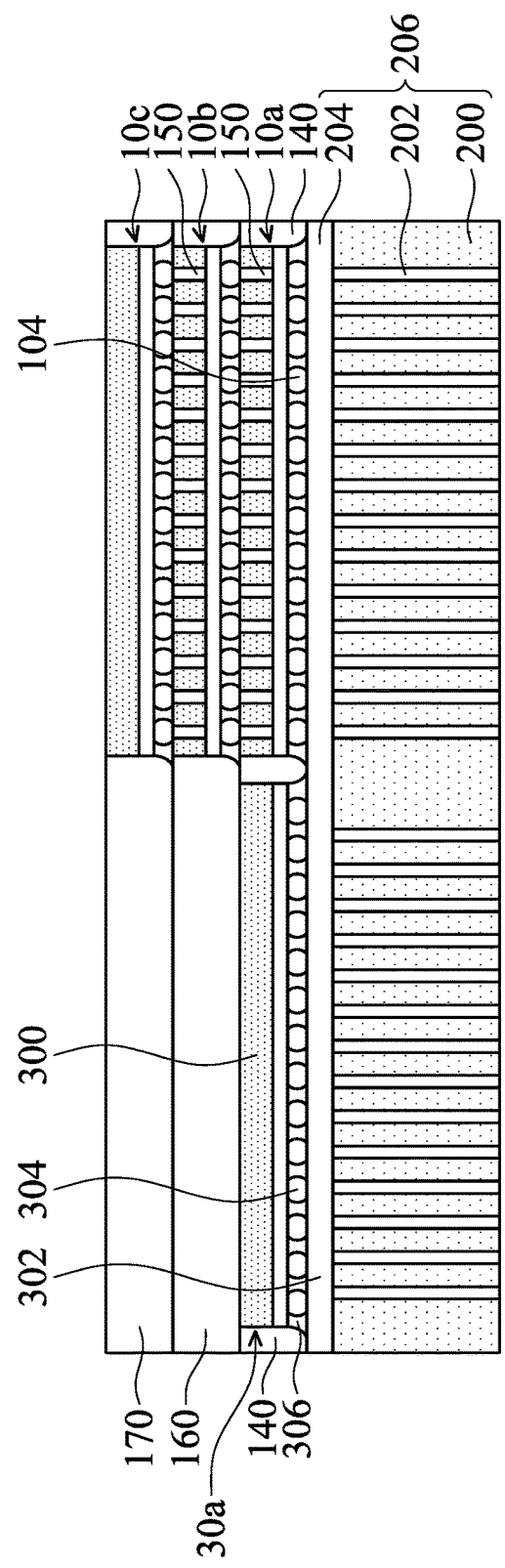
FIG. 4 is a cross-sectional view of a chip package, in accordance with some embodiments

FIG. 4 is a cross-sectional view of a chip package, in accordance with some embodiments. As shown in FIG. 4, the chip package includes a similar structure to that shown in FIG. 3D and can be formed using a method that is the same as or similar to the method shown in FIGS. 3A to 3D. For example, a structure shown in FIG. 3C is provided. Moreover, a TSV process is performed on thinned semiconductor dies 10a to form TSVs 150 therein.

Semiconductor dies that are the same as semiconductor dies 10 are provided and correspondingly mounted on thinned semiconductor dies 10a. Namely, these semiconductor dies and thinned semiconductor dies 10a are homogeneous semiconductor dies with the same functionality. Afterwards, a noble metal layer (not shown) that includes nanopores irregularly distributed therein is formed to cover each of these semiconductor dies using the method shown in FIG. 3B. Note that semiconductor dies 30a are not covered by the noble metal layer. In some embodiments, the noble metal layer is made of a material that is the same as that of the noble metal layer 110 and the material includes gold, silver, platinum, or palladium.

The carrier substrate 206 with these semiconductor dies covered by the noble metal layer is immersed into an etchant solution using the method shown in FIG. 3B, so as to correspondingly form thinned semiconductor dies 10b on thinned semiconductor dies 10a. Afterwards, the carrier substrate 206 with thinned semiconductor dies 10b is removed from the etchant solution and a cleaning process is performed on the carrier substrate 206 with thinned semiconductor dies 10b, as per the method shown in FIG. 3B.

A package layer 160 that is the same as or similar to the package layer 140 is formed over the package layer 140 to encapsulate thinned semiconductor dies 10a, 10b and 30a. Afterwards, the package layer 160 is partially removed and the noble metal layer on semiconductor dies 10b is entirely removed to expose each of thinned semiconductor dies 10b using the method shown in FIG. 3C. In some embodiments, each of the thinned semiconductor dies 10a and each of the thinned semiconductor dies 10b have a thickness in a range of about 5 µm to 10 µm.

Similarly, thinned semiconductor dies 10c that are the same as thinned semiconductor dies 10a or 10b and a package layer 170 that is the same as the package layer 140 or 160 can be stacked on the package layer 160 and thinned semiconductor dies 10b using the method shown in FIGS. 3A to 3C. Afterwards, the base 200 of carrier substrate 206 is thinned using the method shown in FIG. 3D. In some embodiments, a dicing process is performed on the carrier substrate 206 to form multiple chip packages, in which the chip package may include one or more thinned semiconductor dies 30a and one or more sets of stacked and thinned semiconductor dies 10a, 10b, and 10c, as shown in FIG. 4.

Embodiments of the disclosure provide structures and formation methods of chip packages. According to some embodiments of the disclosure, since the semiconductor dies are thinned by MaCE, ultra-thin semiconductor dies can be accomplished, thereby reducing the dimensions (e.g., the height) of the chip package. Also, since the semiconductor dies are thinned by MaCE, stress induced by a physical backside thinning process (i.e., grinding process) can be eliminated, thereby increasing the reliability of the chip packages. Moreover, the MaCE can be performed in a batch wet etching apparatus, and therefore the throughput of the chip packages can be greatly increased and the manufacturing cost can be significantly reduced. Additionally, since the semiconductor dies are thinned by MaCE, heterogeneous semiconductor dies with different functionalities can be integrated in one package and arranged side-by-side. As a result, the chip package with heterogeneous semiconductor dies can have a smaller height than the PoP structure with heterogeneous semiconductor dies.

In accordance with some embodiments, a method for forming a chip package is provided. The method includes providing at least one carrier substrate. The carrier substrate includes first semiconductor dies mounted thereon. The method also includes forming a first noble metal layer to cover each one of the first semiconductor dies. The first noble metal layer includes nanopores irregularly distributed therein. The method further includes immersing the carrier substrate with the first semiconductor dies into an etchant solution, so that each one of the first semiconductor dies covered by the first noble metal layer is thinned, and removing the carrier substrate with the thinned first semiconductor dies from the etchant solution. The etchant solution includes a fluoride etchant and an oxidizing agent.

In accordance with some embodiments, a method for forming a chip package is provided. The method includes providing at least one carrier substrate. The carrier substrate includes first semiconductor dies and second semiconductor dies mounted thereon. The first and second semiconductor dies are heterogeneous semiconductor dies with different functionalities. The method also includes forming a first noble metal layer to cover each one of the first semiconductor dies and each one of the second semiconductor dies. The first noble metal layer includes nanopores irregularly distributed therein. The method further includes immersing the carrier substrate with the first and second semiconductor dies into an etchant solution, so that each one of the first semiconductor dies and each one of the second semiconductor dies that are covered by the first noble metal layer are thinned, and removing the carrier substrate with the thinned first semiconductor dies and the thinned second semiconductor dies from the etchant solution. The etchant solution includes a fluoride etchant and an oxidizing agent.

In accordance with some embodiments, a method for thinning silicon substrates is provided. The method includes providing a plurality of silicon substrates. The method also includes covering a surface of each of the silicon substrates with a noble metal layer. The noble metal layer includes nanopores irregularly distributed therein. The method further includes immersing each of the silicon substrates that is covered by the noble metal layer into an etchant solution including a fluoride etchant and an oxidizing agent, so that each of the silicon substrates is thinned from the surface thereof, and removing each of the thinned silicon substrates from the etchant solution.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip package, comprising:
   providing at least one carrier substrate, wherein the carrier substrate comprises a plurality of first semiconductor dies mounted thereon;
   forming a first noble metal layer to cover each one of the first semiconductor dies, wherein the first noble metal layer comprises nanopores irregularly distributed therein;
   immersing the carrier substrate with the first semiconductor dies into an etchant solution, so that each one of the first semiconductor dies covered by the first noble metal layer is thinned, wherein the etchant solution comprises a fluoride etchant and an oxidizing agent; and
   removing the carrier substrate with the thinned first semiconductor dies from the etchant solution.

2. The method as claimed in claim 1, wherein the first noble metal layer comprises gold, silver, platinum, or palladium.

3. The method as claimed in claim 1, wherein the fluoride etchant comprises hydrofluoric acid (HF) and the oxidizing agent comprises hydrogen peroxide ($H_2O_2$).

4. The method as claimed in claim 1, further comprising:
   forming a first package layer over the carrier substrate to encapsulate each of the thinned first semiconductor dies; and
   performing a first grinding process to partially remove the first package layer and entirely remove the first noble metal layer to expose each of the thinned first semiconductor dies.

5. The method as claimed in claim 4, further comprising:
   correspondingly mounting a plurality of second semiconductor dies on the thinned first semiconductor dies after performing the first grinding process;
   forming a second noble metal layer to cover each of the second semiconductor dies, wherein the second noble metal layer comprises nanopores irregularly distributed therein;
   immersing the carrier substrate with the second semiconductor dies into the etchant solution, so that each one of the second semiconductor dies covered by the second noble metal layer is thinned;
   removing the carrier substrate with the thinned second semiconductor dies from the etchant solution;
   forming a second package layer over the first package layer to encapsulate the thinned second semiconductor dies; and performing a second grinding process to partially remove the second package layer and entirely remove the second noble metal layer to expose each of the thinned second semiconductor dies.

6. The method as claimed in claim 5, wherein the first and second semiconductor dies are homogeneous semiconductor dies with the same functionality.

7. The method as claimed in claim 5, wherein the second noble metal layer is made of a material that is the same as that of the first noble metal layer and the material comprises gold, silver, platinum, or palladium.

8. The method as claimed in claim 5, wherein each of the thinned first semiconductor dies and each of the thinned second semiconductor dies have a thickness in a range of about 5 μm to 10 μm.

9. A method for forming a chip package, comprising:
providing at least one carrier substrate, wherein the carrier substrate comprises a plurality of first semiconductor dies and a plurality of second semiconductor dies mounted thereon, wherein the first and second semiconductor dies are heterogeneous semiconductor dies with different functionalities;
forming a first noble metal layer to cover each one of the first semiconductor dies and each one of the second semiconductor dies, wherein the first noble metal layer comprises nanopores irregularly distributed therein;
immersing the carrier substrate with the first and second semiconductor dies into an etchant solution, so that each one of the first semiconductor dies and each one of the second semiconductor dies that are covered by the first noble metal layer are thinned, wherein the etchant solution comprises a fluoride etchant and an oxidizing agent; and
removing the carrier substrate with the thinned first semiconductor dies and the thinned second semiconductor dies from the etchant solution.

10. The method as claimed in claim 9, wherein the first noble metal layer comprises gold, silver, platinum, or palladium.

11. The method as claimed in claim 9, wherein the fluoride etchant comprises hydrofluoric acid (HF) and the oxidizing agent comprises hydrogen peroxide ($H_2O_2$).

12. The method as claimed in claim 9, further comprising:
forming a first package layer over the carrier substrate to encapsulate each of the thinned first semiconductor dies and each of the thinned second semiconductor dies; and
performing a first grinding process to partially remove the first package layer and entirely remove the first noble metal layer to expose each of the thinned first semiconductor dies and each of the thinned second semiconductor dies.

13. The method as claimed in claim 12, further comprising:
correspondingly mounting a plurality of third semiconductor dies on the thinned first semiconductor dies after performing the first grinding process, wherein the thinned first semiconductor dies and the third semiconductor dies are homogeneous semiconductor dies with the same functionality;
forming a second noble metal layer to cover each of the third semiconductor dies, wherein the second noble metal layer comprises nanopores irregularly distributed therein;
immersing the carrier substrate with the third semiconductor dies into the etchant solution, so that each one of the third semiconductor dies covered by the second noble metal layer is thinned;
removing the carrier substrate with the thinned first and third semiconductor dies and the second semiconductor dies from the etchant solution;
forming a second package layer over the first package layer to encapsulate the thinned third semiconductor dies and the second semiconductor dies; and
performing a second grinding process to partially remove the second package layer and entirely remove the second noble metal layer to exposed each of the thinned third semiconductor dies.

14. The method as claimed in claim 13, wherein second noble metal layer is made of a material that is the same as that of the first noble metal layer and the material comprises gold, silver, platinum, or palladium.

15. The method as claimed in claim 13, wherein each of the thinned first and third semiconductor dies and each of the thinned second semiconductor dies have a thickness in a range of about 5 μm to 10 μm.

16. A method for thinning silicon substrates, comprising:
providing a plurality of silicon substrates;
covering a surface of each of the silicon substrates with a noble metal layer, wherein the noble metal layer comprises nanopores irregularly distributed therein;
immersing each of the silicon substrates that is covered by the noble metal layer into an etchant solution comprising a fluoride etchant and an oxidizing agent, so that each of the silicon substrates is thinned from the surface thereof; and
removing each of the thinned silicon substrates from the etchant solution.

17. The method as claimed in claim 16, wherein the noble metal layer comprises gold, silver, platinum, or palladium.

18. The method as claimed in claim 16, wherein the fluoride etchant comprises hydrofluoric acid (HF) and the oxidizing agent comprises hydrogen peroxide ($H_2O_2$).

19. The method as claimed in claim 18, wherein the etchant solution further comprises deionized water ($H_2O$), and wherein the volume ratio of $HF:H_2O_2:H_2O$ is in a range of 1-5:3-20:10-90.

20. The method as claimed in claim 16, further comprising:
performing a cleaning process on each of the thinned silicon substrates after removing each of the thinned silicon substrates from the etchant solution; and
removing the noble metal layer from each of the thinned silicon substrates.

* * * * *